(12) United States Patent
Rinerson et al.

(10) Patent No.: US 7,326,979 B2
(45) Date of Patent: Feb. 5, 2008

(54) RESISTIVE MEMORY DEVICE WITH A TREATED INTERFACE

(75) Inventors: Darrell Rinerson, Cupertino, CA (US);
Wayne Kinney, Emmett, ID (US);
John E. Sanchez, Jr., Palo Alto, CA (US); Steven W. Longcor, Mountain View, CA (US); Steve Kuo-Ren Hsia, San Jose, CA (US); Edmond Ward, Monte Sereno, CA (US); Christophe Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 27 days.

(21) Appl. No.: 10/665,882

(22) Filed: Sep. 19, 2003

(65) Prior Publication Data

US 2004/0159828 A1    Aug. 19, 2004

(51) Int. Cl.
*H01L 29/76* (2006.01)
(52) U.S. Cl. ............................ 257/295; 257/E27.006; 438/385
(58) Field of Classification Search ................ 257/295, 257/379, 536, 537, E27.006, E21.294, E21.495; 365/45, 46, 100, 148, 158, 159; 438/385
See application file for complete search history.

(56) References Cited

U.S. PATENT DOCUMENTS

| | | | | |
|---|---|---|---|---|
| 3,886,577 A | * | 5/1975 | Buckley | ......................... 257/3 |
| 5,541,869 A | * | 7/1996 | Rose et al. | .................. 365/100 |
| 5,955,774 A | * | 9/1999 | Kang | .......................... 257/533 |
| 6,204,139 B1 | | 3/2001 | Liu et al. | ..................... 438/385 |
| 6,473,332 B1 | * | 10/2002 | Ignatiev et al. | ............. 365/148 |
| 6,487,106 B1 | * | 11/2002 | Kozicki | ...................... 365/153 |
| 6,569,745 B2 | * | 5/2003 | Hsu | ........................... 438/385 |
| 6,693,821 B2 | * | 2/2004 | Hsu et al. | .................... 365/158 |
| 6,759,249 B2 | * | 7/2004 | Zhuang et al. | ................. 438/3 |
| 6,927,120 B2 | * | 8/2005 | Hsu et al. | ................... 438/240 |
| 2003/0219534 A1 | * | 11/2003 | Zhuang et al. | ............. 427/240 |
| 2004/0161888 A1 | * | 8/2004 | Rinerson et al. | ............ 438/210 |

OTHER PUBLICATIONS

N. Noginova et al., Conductivity and Switching Phenomena in Mn-doped Perovskite Single Crystals and Manganite Thin Films, 2001, The American Physical Society, Physical Review B, vol. 63, 174414, pp. 1-6.*
Liu et al., Reproducible Electric-Pulse Induced Resistive (EPIR) Switch Effect of Manganite Films for Non-Volatile Memory Applications, Nov. 4, 2002, University of Houston.*
Baikalov et al., "Field-Driven Hysteric and Reversible Resistive Switch at the Ag $Pr_{0.7}Ca_{0.3}MnO_3$ Interface", May 2003, Department of Physics and Texas Center for Superconductivity, University of Houston, pp. 1-8.
Beck et al., "Reproducible switching effect in thin oxide films for memory applications", Jul. 2000, Applied Physics Letters, vol. 77, No. 1, pp. 139-141.

(Continued)

*Primary Examiner*—Kenneth Parker
*Assistant Examiner*—William Kraig

(57) ABSTRACT

A multi-resistive state element that uses a treated interface is provided. A memory plug includes at least two electrodes that sandwich a multi-resistive state element. Using different treatments on both electrode/multi-resistive state element interfaces improves the memory properties of the entire memory device.

8 Claims, 15 Drawing Sheets

OTHER PUBLICATIONS

Gerstner et al., "Nonvolatile memory effects in nitrogen doped tetrahedral amorphous carbon thin films," Nov. 1998, Journal of Applied Physics, vol. 84, No. 10, pp. 5647-5651.

Mieville et al., "Transport across conducting ferromagnetic oxide/metal interfaces", Sep. 1998, Applied Physics Letters, vol. 73, No. 12, pp. 1736-1738.

Liu et al., "A New Concept for Non-Volatile Memory: The Electric-Pulse Induced Resistive Change Effect in Colossal Magnetoresistive Thin Films", University of Houston, pp. 1-7.

Liu et al., "Electric-pulse-induced reversible resistance change effect in magnetoresistive films", May 2000, Applied Physics Letters, vol. 76, No. 19, pp. 2749-2751.

Plecenik et al., "Degradation of $LaMnO_{3-y}$ surface layer in $LaMnO_{3-y}$/metal interface", Jul. 2002, Applied Physics Letters, vol. 81, No. 5, pp. 859-861.

Rossel et al., "Electrical current distribution across a metal-insulator-metal structure during bistable switching", Sep. 2001, Journal of Applied Physics, vol. 90, No. 6, pp. 2892-2898.

Simmons et al., "New conduction and reversible memory phenomena in thin insulating films", 1967, Proc. Roy. Soc. A, vol. 301, pp. 77-102.

Tulina et al., "Reproducible switching in normal metal-manganite single crystal point contacts with memory effect", 2003, Physica C., vol. 385, pp. 563-567.

Tulina et al., "Reversible electrical switching at the $Bi_2Sr_2CaCu_2O_{8+y}$ surface in the normal metal—$Bi_2Sr_2CaCu_2O_{8+y}$ single crystal heterojunction," 2001, Physica C., vol. 366, pp. 23-30.

Watanabe et al., "Current-driver insulator-conductor transition and nonvolatile memory in chromium-doped $SrTiO_3$ single crystals," Jun. 2001, Applied Physics Letters, vol. 78, No. 23, pp. 3738-3740.

Ziese et al., "Voltage-controlled colossal magnetoresistance in manganite/normal-metal neterostructures", Feb. 1998, Physical Review B, vol. 57, No. 5, pp. 2963-2966.

* cited by examiner

RESISTIVE MEMORY DEVICE WITH A TREATED INTERFACE

CROSS-REFERENCE TO RELATED APPLICATIONS

This application is related to the following U.S. patent applications: application Ser. No. 10/360,005, filed Feb. 7, 2003, now U.S. Pat. No. 6,917,539; application Ser. No. 10/330,153, filed Dec. 26, 2002, now U.S. Pat. No. 6,834,008; application Ser. No. 10/330,964, filed Dec. 26, 2002, now U.S. Pat. No. 6,831,854; application Ser. No. 10/330,170, filed Dec. 26, 2002, now U.S. Pat. No. 6,970,375; application Ser. No. 10/330,900, filed Dec. 26, 2002, now U.S. Pat. No. 6,850,429; application Ser. No. 10/330,150, filed Dec. 26, 2002, now U.S. Pat. No. 6,798,685; application Ser. No. 10/330,965, filed Dec. 26, 2002, now U.S. Pat. No. 6,850,455; application Ser. No. 10/249,846, filed May 12, 2003, now U.S. Pat. No. 6,859,382; application Ser. No. 10/249,848, filed May 12, 2003, now U.S. Pat. No. 6,856,536; application Ser. No. 10/612,733, filed Jul. 1, 2003; application Ser. No. 10/613,099, filed Jul. 1, 2003, now U.S. Pat. No. 6,836,421; application Ser. No. 10/612,191, filed Jul. 1, 2003, now U.S. Pat. No. 6,906,939; application Ser. No. 10/612,263, filed Jul. 1, 2003, now U.S. Pat. No. 7,009,909; application Ser. No. 10/612,776, filed Jul. 1, 2003; application Ser. No. 10/604,606, filed Aug. 4, 2003; U.S. patent application Ser. No. 10/330,512, filed Dec. 26, 2002, now U.S. Pat. No. 6,753,561, and application Ser. No. 10/634,636, filed Aug. 4, 2003, now U.S. Pat. No. 7,038,935. All of the above applications are hereby incorporated herein by reference in their entireties and for all purposes.

BACKGROUND OF THE INVENTION

1. Field of the Invention

The present invention relates generally to computer memory, and more specifically to the fabrication of memory elements.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be generated from two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF THE INVENTION

The present invention provides a resistive memory device that can be used as a fundamental element in a memory cell. Each resistive memory device includes a conductive top and bottom electrode, and a multi-resistive state element. The multi-resistive state element is arranged on top of and in contact with the bottom electrode such that a bottom interface is created and the conductive top electrode is arranged on top and in contact with the multi-resistive state element such that a top interface is created. Either the top interface, the bottom interface or both interfaces are subjected to a treatment directed towards changing properties of the interface.

Furthermore, the resistivity of the multi-resistive state element may be changed by applying a first voltage having a first polarity across the electrodes and reversibly changed by applying a second voltage having a second polarity across the electrodes.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGS. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Overview

In the creation of an electrode/memory element/electrode stack, at least one of the interfaces between the memory element and the electrodes can be subjected to special treatment to improve the memory and switching properties of this stack.

The Memory Array

Conventional nonvolatile memory requires three terminal MOSFET-based devices. The layout of such devices is not ideal, usually requiring feature sizes of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized.

Figure 1:
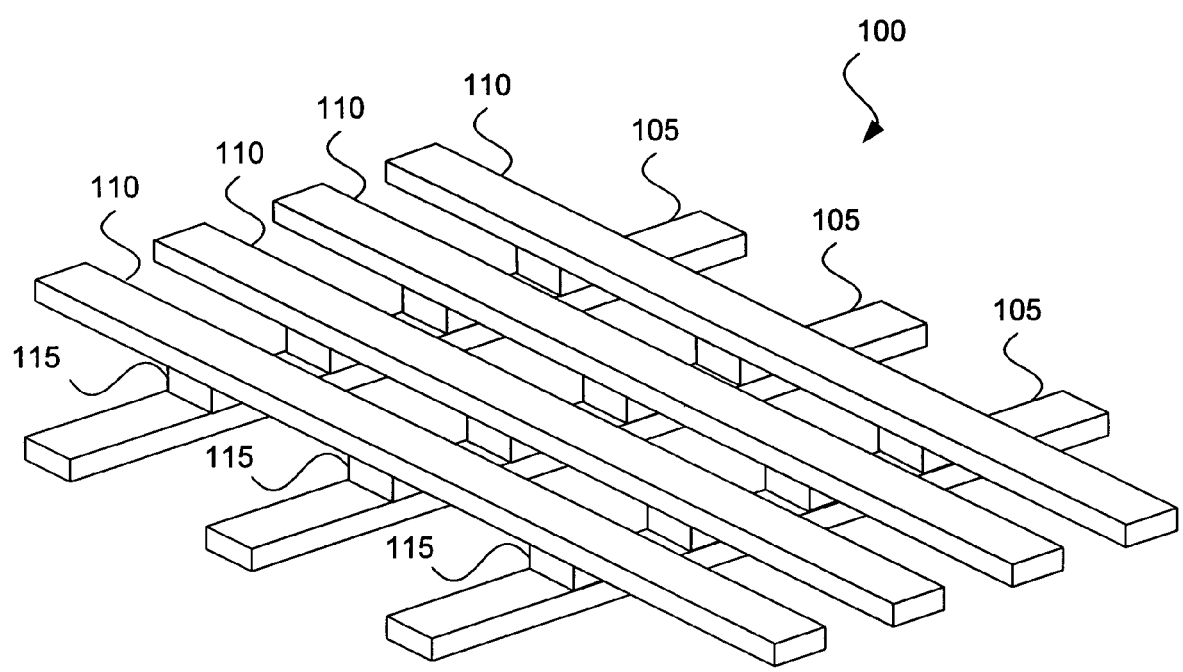
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2:
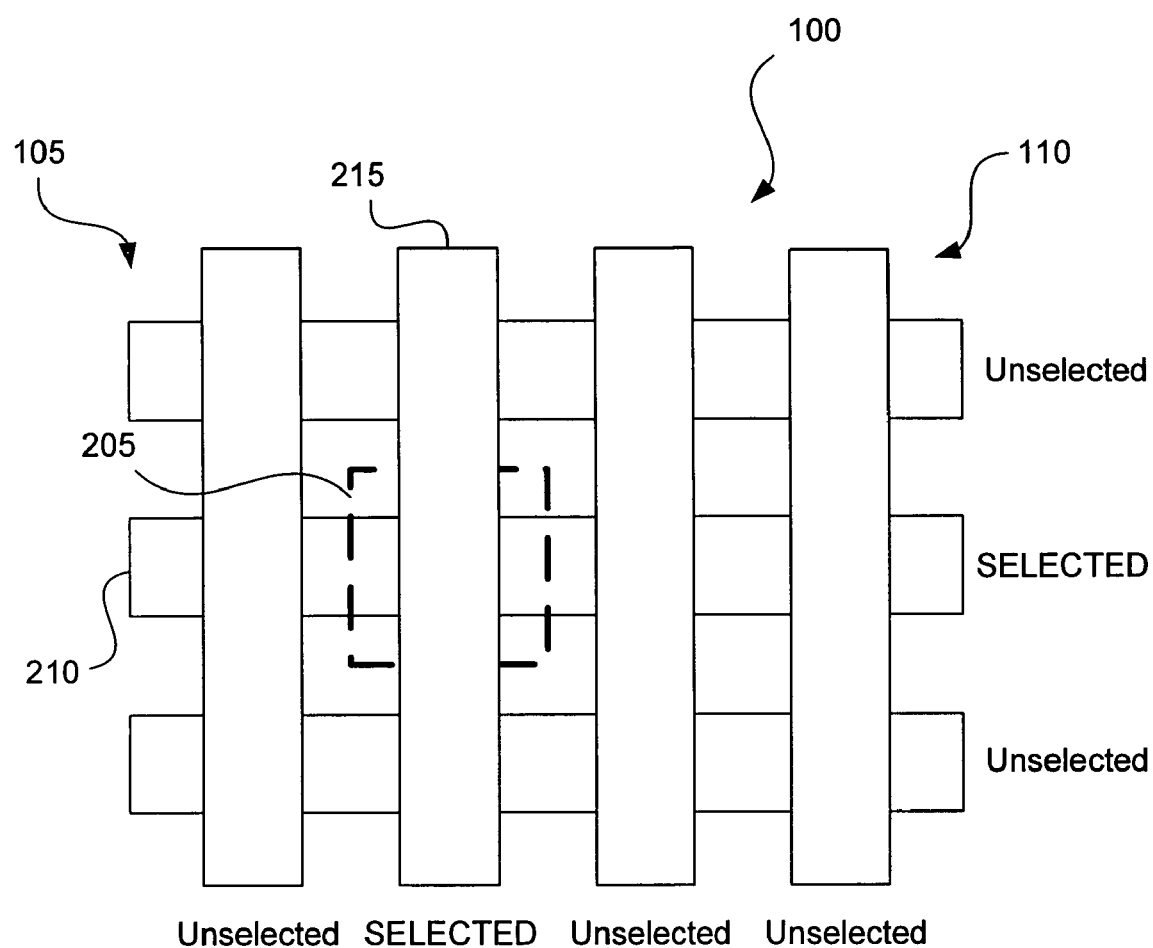
FIG. 2 depicts a plan view of selection of a memory cell in the cross point array depicted in FIG. 1.
Figure 3:
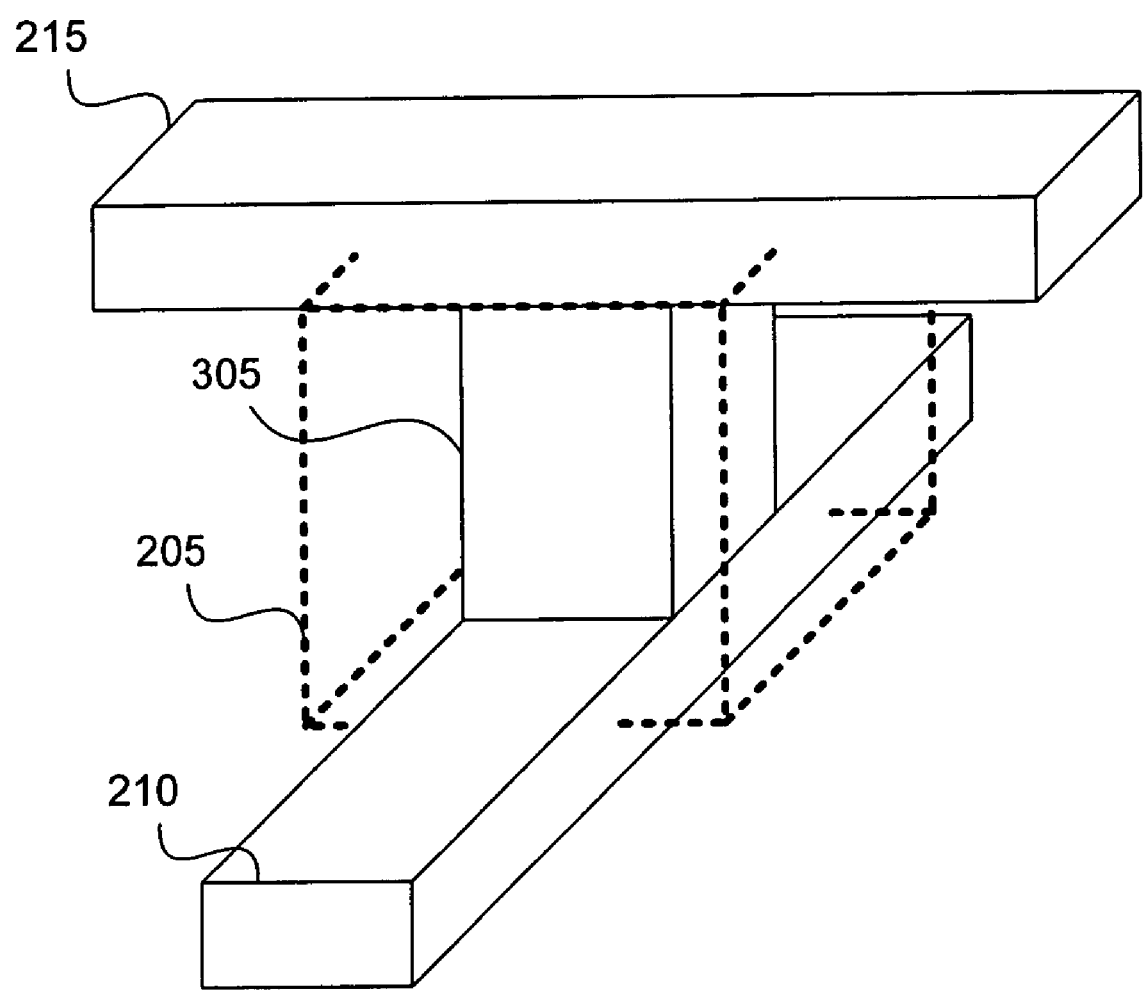
FIG. 3 depicts a perspective view of the boundaries of the selected memory cell depicted in FIG. 2.

FIG. 2 illustrates selection of a memory cell 205 in the cross point array 100. The point of intersection between a single x-direction conductive array line 210 and a single y-direction conductive array line 215 uniquely identifies the single memory cell 205. FIG. 3 illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 4:
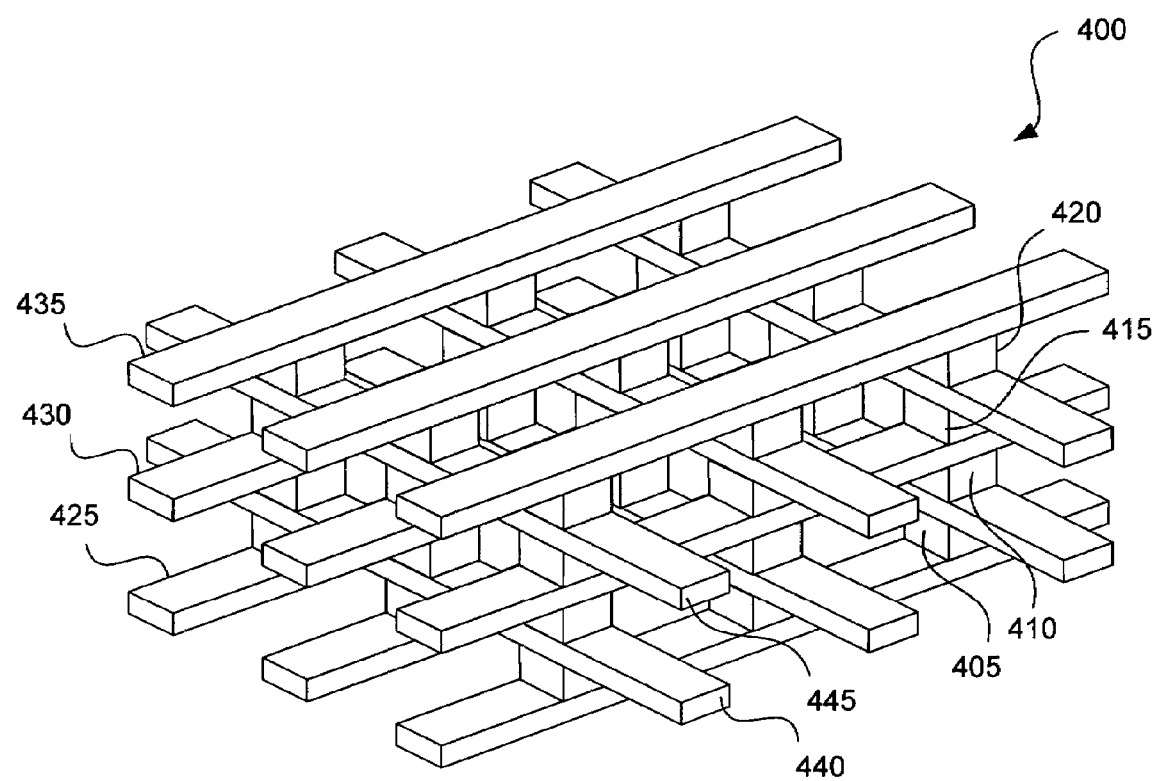
FIG. 4 depicts a perspective view of an exemplary stacked cross point memory array employing four layer of memory.

FIG. 4 depicts an exemplary stacked cross point array 400 employing four memory layers 405, 410, 415, and 420. The memory layers are sandwiched between alternating layers of x-direction conductive array lines 425, 430 and 435 and y-direction conductive array lines 440 and 445 such that each memory layer 405, 410, 415, and 420 is associated with only one x-direction conductive array line layer and one y-direction conductive array line layer. Although the top conductive array line layers 435 and bottom conductive array line layer 425 are only used to supply voltage to a single memory layer 405 and 420, the other conductive array line layers 430, 440, and 445 can be used to supply voltage to both a top and a bottom memory layer 405, 410, 415, or 420.

Referring back to FIG. 2, the repeatable cell that makes up the cross point array 100 can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

Generally, the benefit of the cross point array is that the active circuitry that drives the cross point array 100 or 400 can be placed beneath the cross point array, therefore reducing the footprint required on a semiconductor substrate. Co-pending U.S. patent application, "Layout Of Driver Sets In A Cross Point Memory Array," U.S. application Ser. No. 10/612,733, filed Jul. 1, 2003, already incorporated by reference, describes various circuitry that can achieve a small footprint underneath both a single layer cross point array 100 and a stacked cross point array 400.

Figure 5:
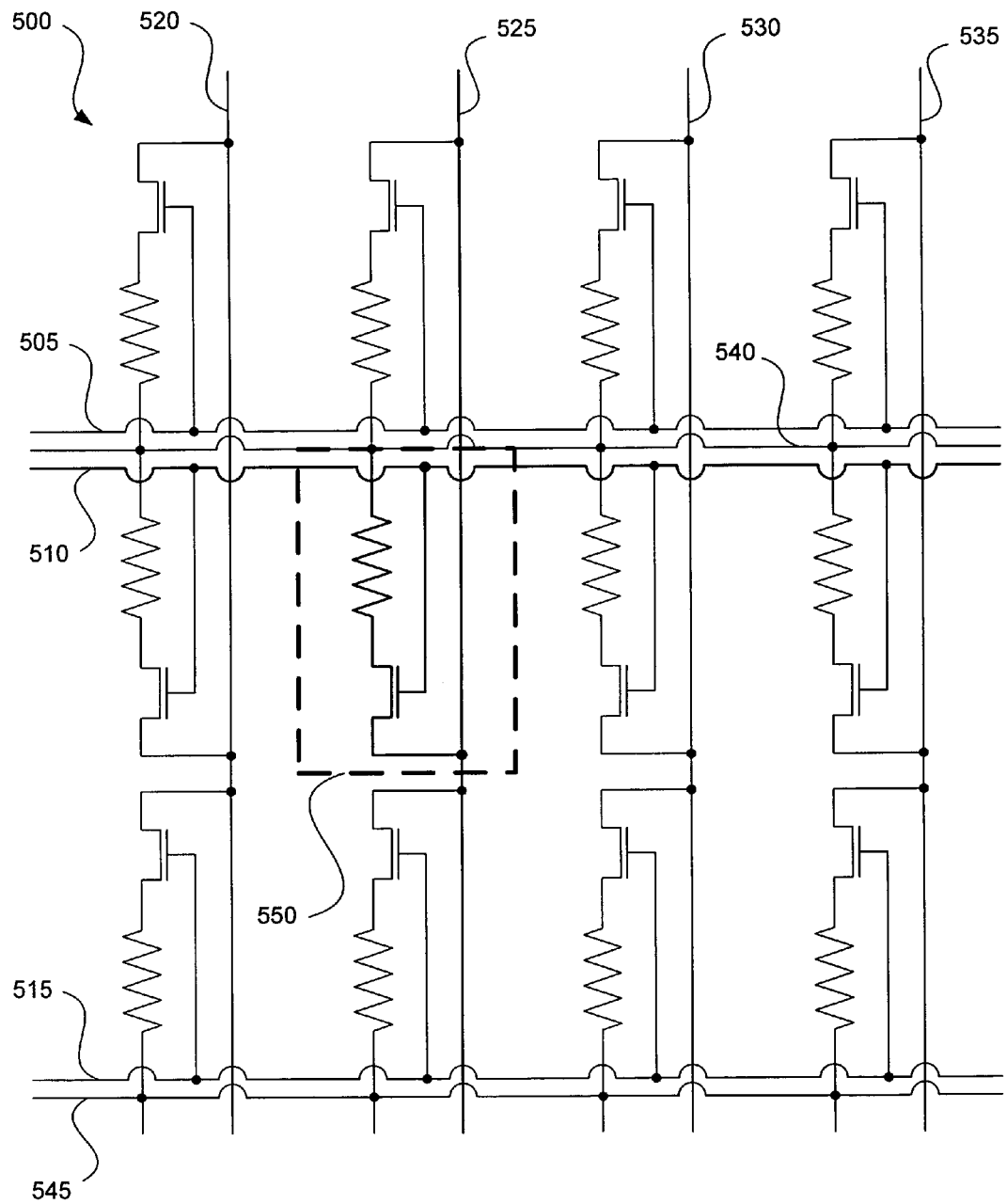
FIG. 5 depicts a schematic diagram of selection of a memory cell in a transistor memory array.

The cross point array is not the only type of memory array that can be used with a two-terminal memory element. FIG. 5 is a schematic representation of an array 500 of memory cells laid out in a two-dimensional transistor memory array 500. Each memory cell in the transistor memory array 500 is connected to one select line 505, 510, or 515, one data line 520, 525, 530, or 535, and a reference line 540 or 545. In one embodiment, all reference lines 540 and 545 are held to the same voltage, and perhaps even tied together. Therefore, a single select line 510 and a single data line 525 uniquely define an individual memory cell 550.

By connecting the select lines 505, 510, and 515 to the gates of field effect transistors (FETs), the select lines 505, 510, and 515 can control whether current from the data lines 520, 525, 530, and 535 are able to pass to the memory plugs. The data lines 520, 525, 530, and 535 both carry the data from the memory cells during READ operations and provides the memory cells with a voltage pulse appropriate to change the resistive state of the memory plug during WRITE operations. Selection circuitry used to select a specific data line 520, 525, 530, or 535 would generally be placed outside the select transistor memory array 500.

Figure 6:
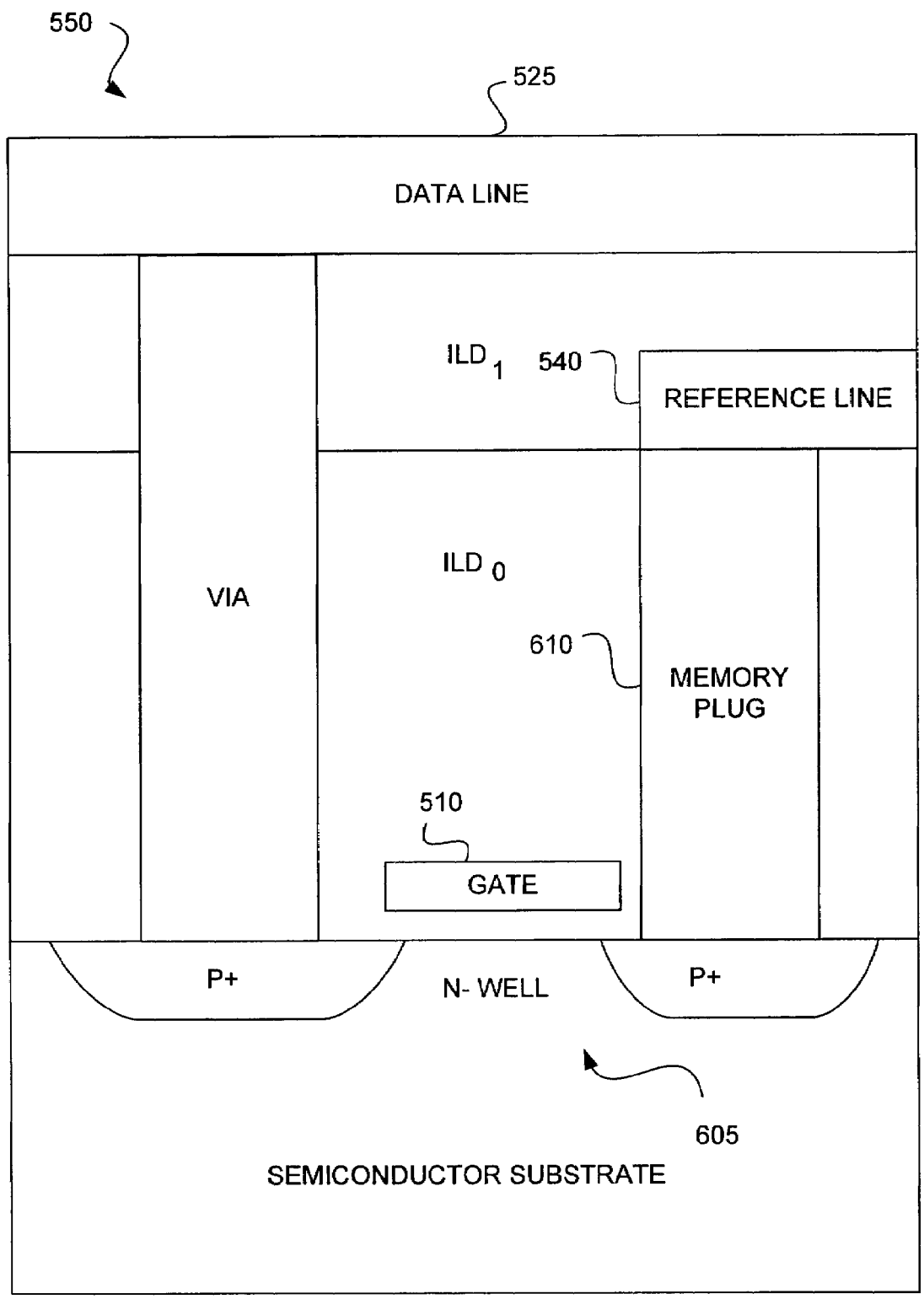
FIG. 6 depicts a cross section of the selected memory cell depicted in FIG. 5.

FIG. 6 is a diagrammatic representation of the memory cell 550 that can be used in a transistor memory array 500. Each memory cell 550 includes a transistor 605 and a memory plug 610. The transistor 605 is used to permit current from the data line 525 to access the memory plug 610 when an appropriate voltage is applied to the select line 510, which is also the transistor's gate. The reference line 540 might span two cells if the adjacent cells are laid out as the mirror images of each other. Co-pending U.S. patent application, "Non-Volatile Memory with a Single Transistor and Resistive Memory Element," U.S. application Ser. No. 10/249,848, filed May 12, 2003, already incorporated by reference, describes the specific details of designing and fabricating a select transistor memory array.

The Memory Plug

Each memory plug 305 or 610 contains a memory element along with any other materials that may be desirable for fabrication or functionality. For example, the additional materials might include electrodes and a non-ohmic device, as is described in co-pending application "High Density NVRAM," U.S. application Ser. No. 10/360,005, filed Feb. 7, 2003, already incorporated by reference. The non-ohmic device exhibits a very high resistance regime for a certain range of voltages ($V_{NO-}$ to $V_{NO+}$) and a very low resistance regime for voltages above and below that range. Together, the memory element and the non-ohmic device cause the memory plug 305 or 610 to exhibit a non-linear resistive characteristic. While a non-ohmic device might be desirable in certain arrays, it may not be helpful in other arrays.

Figure 7:
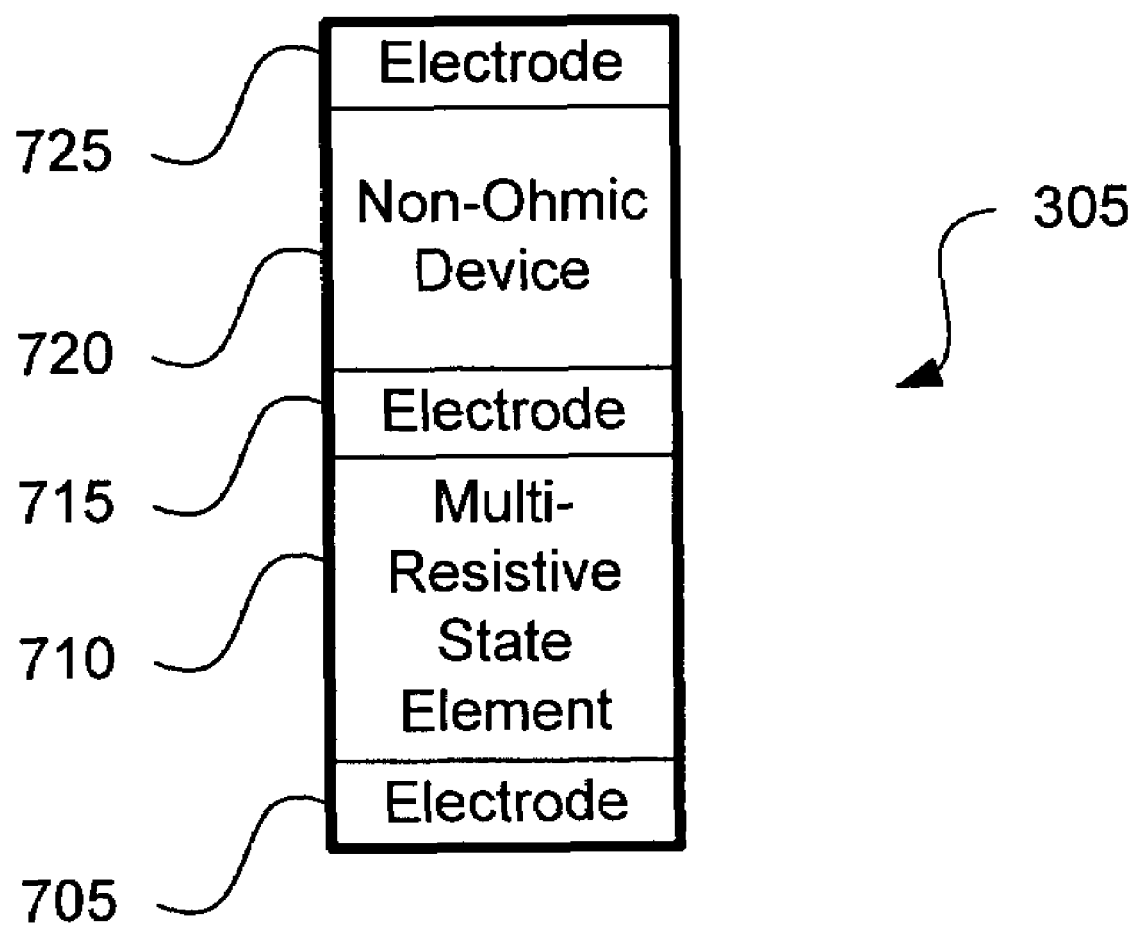
FIG. 7 depicts an elevation view of an exemplary memory plug with five layers.

FIG. 7 depicts a side view of an exemplary five-layer memory plug 305 with a non-ohmic device. The five layers are: a first electrode layer 705, a layer of a multi-resistive state element 710, a second electrode layer 715, a layer making up the non-ohmic device 720, and a third electrode 725. Some layers may actually be made up of multiple thin films. For example, one type of non-ohmic device 720 uses a three film metal-insulator-metal (MIM) structure. Additionally, certain multi-resistive state elements use multiple thin films. Furthermore, not all the layers are required for every memory plug 305 or 610 configuration. For example, certain cross point arrays may use means other than the non-ohmic device 720 to prevent unselected memory plugs from being disturbed.

The Electrodes

The fabrication techniques used for the memory plug 305 or 610 will typically dictate the requirements of the layers beneath the memory plug (e.g., the select lines 505, 510, and 515 in the transistor memory array 500). Certain fabrication process (e.g., solution based spin on followed by high temperature anneal, pulsed laser deposition, sputtering, and metalorganic chemical vapor deposition) might require that refractory metals be used for these layers so that they may withstand the high temperature fabrication process. However, refractory metals have higher resistances, which may limit the number of cells on an array.

Typical electrodes 705, 715 and 725 commonly used in fabrication include Pt, Au, Ag and Al. If the only purpose of the electrodes 705, 715 and 725 is as a barrier to prevent metal inter-diffusion, then a thin layer of metal, e.g. TiN, could be used. However, conductive oxide electrodes may provide advantages beyond simply acting as a metal inter-diffusion barrier.

For example, a conducting oxide electrode might modify the formation and migration of oxygen vacancies in the memory material. Oxygen vacancies can cause degradation of electrical properties in the multi-resistive state element 710. A conducting oxide electrode can also withstand high temperature processing. Most metals either start oxidizing or combining with adjacent materials at temperatures above 400 C. Accordingly, fabrication processes above these temperatures can be considered to be high temperature processing. Additionally, conducting oxide electrodes will not degrade during operation. Regular metal electrodes may degrade due to the electric field and interaction between the metal atoms and the memory material atoms.

Examples of conductive oxides include $LaSrCoO_3$, $RuO_2$, $IrO_2$, $SrRuO_3$, $LaNiO_3$ and doped strontium titanate (STO). The dopant used in STO can be either Nb or Ta to substitute for titanium atoms, or any rare earth such as La or Pr to substitute for strontium atoms. Generally, a conducting oxide electrode is metallic with resistivity below 1 Ω-cm.

Conducting oxide electrodes can be fabricated directly, or can be made with a material that is not initially an oxide, but is subsequently oxidized during further processing or operation. Ru and Ir are both examples of materials that can be oxidized during processing or operation.

Additionally, certain materials oxidize at a finite rate and allow dual layers to form. For example, Ir might be particularly well suited for making contact to an underlying conductive array line layer 105. When Ir is oxidized, the top of the Ir layer becomes $IrO_2$. Since the $IrO_2$ grows at a finite rate it becomes possible to control the oxidation so that a dual layer of $Ir/IrO_2$ is formed. Such a dual layer could provide a good contact on the un-oxidized bottom while still forming an oxygen barrier on the oxidized top.

Furthermore, some conductive oxides electrodes form a good lattice match with the multi-resistive state element 710, and thus lower crystallization temperature for the resistive material. For example, if the multi-resistive state element 710 is STO, possible conductive oxide electrodes that make a good lattice match include doped STO, $LaSrCoO_3$, and $SrRuO_3$. If the multi-resistive state element 710 is PCMO, possible conductive oxide electrodes include the STO electrodes and also $LaNiO_3$. A seed layer will often be used on top of the thin layer of metal. A seed layer will help the formation of the layer grown or deposited above it. For example, the seed layer could be on Pt, Ru, Ir or TiN. Some seed layer/metal layer matches include $LaNiO_3$ or $SrRuO_3$ on Pt, $IrO_2$ on Ir, $RuO_2$ on Ru, and Pt on TiN.

Another benefit to certain conductive oxide electrodes is that stress may be reduced by more closely matching the conductive oxide electrode's coefficient of thermal expansion to the multi-resistive state element 710.

The electrodes 705, 715 and 725 might be further improved by using a layer of metal such as platinum between the multi-resistive state element layer 710 and the conductive oxide electrode. Such implementations advantageously provide a good barrier with the conductive oxide, and a good contact with an adjacent metal layer.

Barrier layers are generally helpful to prevent inter-diffusion of atoms after different materials have been deposited. For example, barrier layers can block the diffusion of metals, oxygen, hydrogen or water. Binary oxides or nitrides with 2 elements and ternary oxides or nitrides with 3 elements are particularly suited to high temperature processing. Unlike a regular electrode like titanium that oxidizes and becomes non-conductive, titanium nitride will not oxidize and will remain conductive until about 500 C. Ternary oxides oxidize at even higher temperatures, typically about 50 C. higher than binary oxides. The rate of oxidation depends on the temperature and the oxygen partial pressure.

Examples of binary nitrides include titanium nitride, tantalum nitride and tungsten nitride. Examples of ternary nitrides include titanium silicon nitride, tantalum aluminum nitride, tantalum silicon nitride, and ruthenium titanium nitride. An example of a ternary oxide is ruthenium tantalum oxide.

As will be appreciated by those skilled in the art, an electrode may require other layers, in order to properly function. For example adhesion layers are sometimes necessary. An adhesion layer is used between a substrate and thin-film layer to improve adhesion of the thin-film layer to substrate. Pt does not stick well to $SiO_2$, so a glue layer, such as Ti or $TiO_2$, is used between them for better adhesion. Similarly, a sacrificial barrier layer is an oxide layer that is deposited for the sole purpose of capturing all the oxygen that could otherwise diffuse into other layers, such as the multi-resistive state element 710. The electrode 705 is considered to consist of everything in between x-direction conductive array line 210 and the multi-resistive state element 710, including any adhesion or sacrificial barrier layers, as required. Similarly, the electrode 715 consists of all layers between the multi-resistive state element 710 and the non-ohmic device 720 and the electrode 725 consists of everything in between the non-ohmic device 720 and the y-direction conductive array line 215.

For example, an electrode may includes a TiN or TiAlN layer, an Ir layer and an $IrO_2$ layer to have good metal barrier and oxygen barrier properties. However, such additional layers are only necessary to the extent they are required. Certain conductive oxide electrodes may provide multiple functions. For example, ternary nitrides and ternary oxides that have one component that is either ruthenium or iridium and another component that is either tantalum or titanium can act as both a barrier layer and a sacrificial high-temperature oxygen barrier.

It will be appreciated that the choice of electrode layers 705, 715 and 725 in combination with the multi-resistive state element layer 710 may affect the properties of the memory plug 305 or 610.

Memory Plug Operation

The various properties of the multi-resistive state element 710 will determine both the lowest possible resistance state and the highest possible resistive state. Although the highest operational resistive state ($R_0$) of the memory plug 305 or 610 does not need to be its highest theoretical state and the lowest operational resistance state ($R_1$) does not need to be its lowest theoretical state, designs can set $R_0$ and $R_1$ close to those states for simplicity.

When considering an operating value of the $R_1$ resistive state, parasitic resistances that are in series with the memory plug must also be considered. Sources of resistance include the contacts and the vias, the metal interconnect lines, and the driver circuits. Parasitic resistances might total 100-200Ω, which puts a lower limit on the memory plug resistance. While the parasitic resistance may be overcome through more complicated circuit design, such designs typically result in loss of access time, or a larger die size.

The $R_1$ state of the memory plug may have an optimal value of 10 kΩ to 100 kΩ. If the $R_1$ state resistance is much less than 10 kΩ, the current consumption will be increased because the cell current is high, and the parasitic resistances will have a larger effect. If the $R_1$ state value is much above 100 kΩ, the RC delays will increase access time. However, workable single state resistive values may still be achieved with resistances as low as 5 kΩ and as high as 1 MΩ. Typically, a single state memory would have the operational voltages of $R_0$ and $R_1$ separated by a factor of 10.

For example, if 1 volt were used as a read voltage ($V_R$), $R_1$ might be about 100 kΩ and $R_0$ might be about 1 MΩ, making the current either 10 μA or 1 μA, depending on the resistive state. Since large currents can be destructive to semiconductors fabricated to small dimensions, no more than 10 μA would be desired for a memory circuit in most cases. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state element 710. Similarly, $V_W$ should be greater than $V_{Wth}$, the threshold at which the resistive material starts to change resistivity, for the same reason. A typical $V_W$ might be about 2 volts, and $V_{Wth}$ might be about 1.5 volts.

It should be noted that changes in the resistive property of the memory plugs that are greater than a factor of 10 might be desirable in multi-bit resistive memory cells that have more than two states. Generally, adjusting the pulse width and magnitude of the voltage pulses across the multi-resistive state element results in different resistive states. Since multi-resistive state element 710 can be placed into several different resistive states, multi-bit resistive memory cells are possible. For example, the multi-resistive state element might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 kΩ, the six intermediary states might have resistive states of about 26.8 kΩ, 72.0 kΩ, 193 kΩ, 518 kΩ, 1.39 MΩ, and 3.73 MΩ. The highest resistive state would then be 10 MΩ, 1000 times the value of the low resistive state. Each optimal resistive state could be calculated by using the relationship $Log(R_{110})=Log(R_{111})+Log K$; $Log(R_{101})=Log(R_{111})+2 Log K$; $Log(R_{100})=Log(R_{111})+3 Log K$; . . . $Log(R_{000})=Log(R_{111})+7 Log K$, where $Log K=(1/7) [Log(R_{000})-Log(R_{111})]$.

Ideally, the multi-resistive state element 710 should switch very quickly from one resistive state to another. Typically, anything less than 50 nanoseconds would be an appropriate switching speed for applications such as mobile phones, PDAs or other portable electronics devices. Additionally, once the multi-resistive state element 710 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multiresistive state element 710.

The Multi-Resistive State Element

Figure 8A:
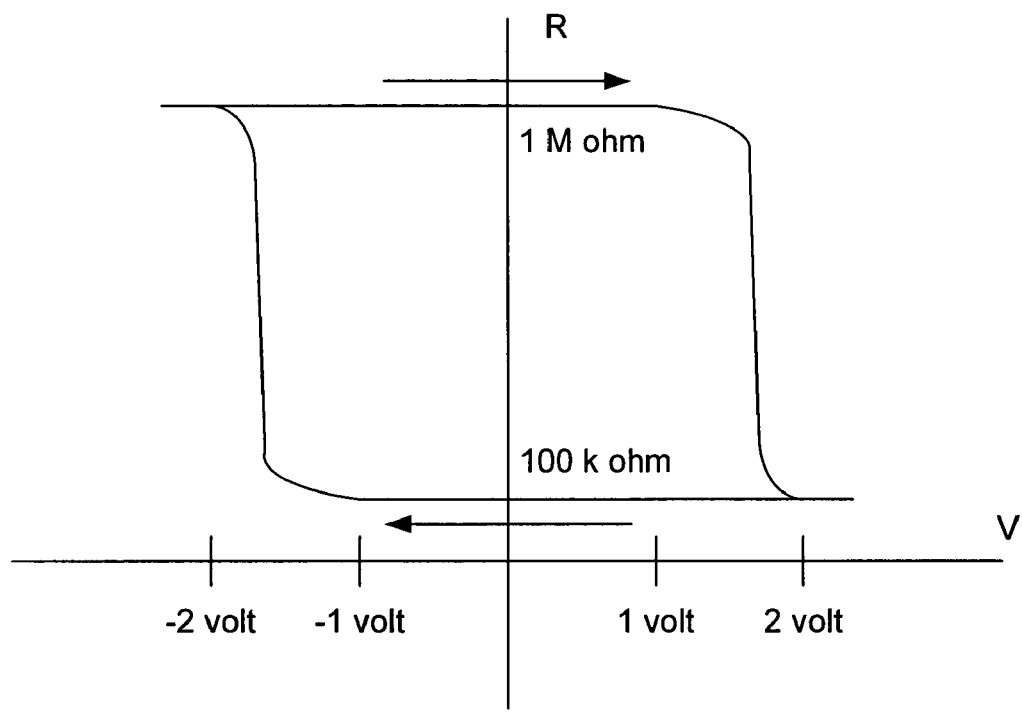
FIG. 8A depicts a graph illustrating exemplary RV characteristics of a memory element initially biased in one direction.

Importantly, the multi-resistive state element 710 should have a hysteresis that allows non-destructive reads. As shown in FIG. 8A any voltages between $-V_R$ (depicted as $-1$ volt) and $+V_R$ (depicted as 1 volt) will have no effect on the resistive state of the memory element (i.e., it will remain at either 100 kΩ or 1 MΩ). Therefore, a WRITE operation is not necessary after a READ operation for such materials.

The hysteresis shown in FIG. 8A has two write threshold voltages, one for when the multi-resistive state element 710 is in the low resistive state $R_1$ and one for when the multi-resistive state element 710 is in the high resistive state $R_0$. In the low resistive state $R_1$, the first write threshold voltage $-V_{Wth}$ is the point above which any voltages applied across the multi-resistive state element 710 have substantially no effect on the resistive state of the multi-resistive state element 710 and below which a voltage pulse will alter the resistance of the multi-resistive state element 710. Similarly, in the high resistive state $R_0$, the second write threshold voltage $+V_{Wth}$ is the point below which any voltages applied across the multi-resistive state element 710 have substantially no effect on the resistive state of the multi-resistive state element 710 and above which a voltage pulse will alter the resistance of the multi-resistive state element 710.

When initially fabricated, the multi-resistive state element 710 may be in a high resistive state $R_0$. The multi-resistive state element 710 then transitions from its high resistive state $R_0$ to a low resistive state $R_1$ in response to a voltage pulse. Whether the bottom terminal is at +3V and the top terminal is at −3V in order to lower the resistive sate or vice-versa depends upon the specific properties of the material that is used. FIG. 8A is an example of the multi-resistive state element 710 that requires a +2V pulse to lower its resistive state and FIG. 8B, a mirror image of FIG. 8A, is an example of the multi-resistive state element 710 that requires a −2V pulse to lower its resistive state.

Generally, the chemical and materials properties of the multi-resistive state element 710 are selected to meet the electrical specifications set forth above. For example, the material preferably has a resistivity of between about 0.1Ω-cm to 1Ω-cm (although workable values may be as high as 5Ω-cm and the multi-resistive state element may be able to achieve a much lower resistivity), exhibits a change in resistance of at least about 10×, and has this resistance change triggered by the application of a voltage pulse of not longer than about 100 ns duration and not greater than about 10V in magnitude.

The multi-resistive state element 710 will generally, but not necessarily, be crystalline, either as a single crystalline structure or a polycrystalline structure. One class of multi-resistive state element 710 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element 710 for use in the memory plug 305 or 610. The compounds that make up the perovskite class of multi-resistive state elements 710 include both normal conductive metal oxides and conductive complex metal oxides.

Figure 8B:
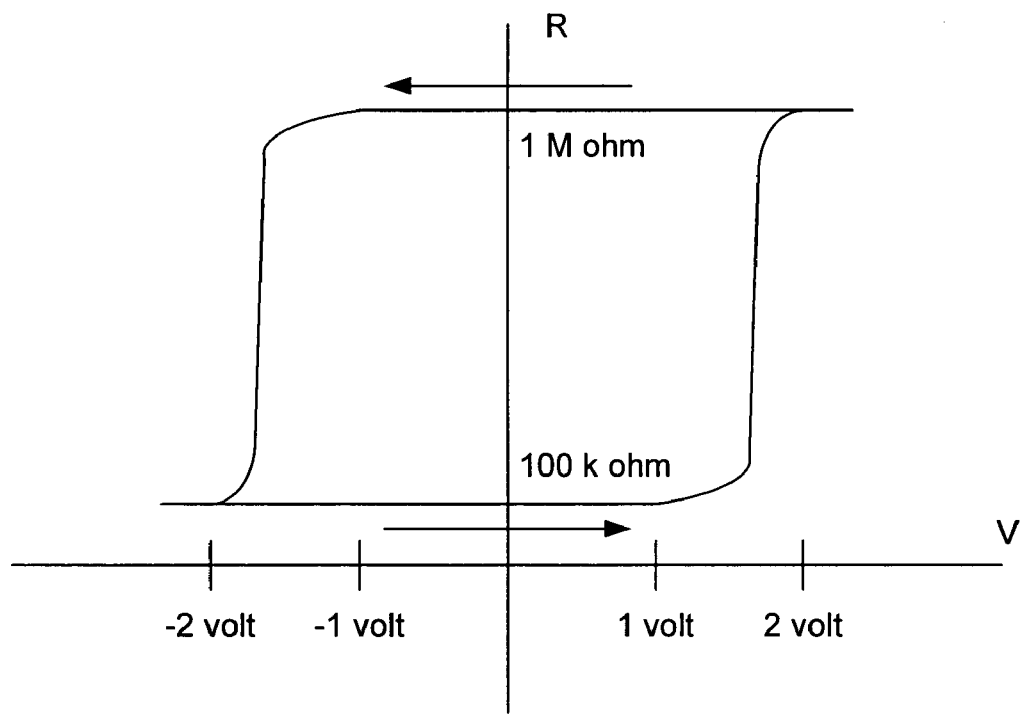
FIG. 8B depicts a graph illustrating exemplary RV characteristics of a memory element initially biased in a direction opposite to the memory element of FIG. 8A.

Multi-resistive state elements 710, however, are not limited to perovskites. Specifically, any material that has a hysteresis effect similar to what is shown in FIG. 8A or 8B could be used in the memory plug 305 or 610. Trapped charges are one mechanism by which the hysteresis effect is created.

Some examples of amorphous materials exhibiting such hysteresis include SiO, as described in "New conduction and reversible memory phenomena in thin insulating films" by J. G. Simmons and R. R. Verderber, Proc. Roy. Soc. A. 301, 1967 pp. 77-102, hereby incorporated by reference for all purposes. Another example is carbon doped with nitrogen, as described in "Nonvolatile memory effects in nitrogen doped tetrahedral amorphous carbon thin films" by E. G. Gerstner and D. R. McKenzie, Journal of Applied Physics, Vol. 84, Num. 10, November 1998, pp. 5647-5651, hereby incorporated by reference for all purposes.

Several different mechanisms might cause a material to have trapped charges. Co-pending U.S. patent applications, "A 2-Terminal Trapped Charge Memory Device with Voltage Switchable Multi-Level Resistance," U.S. application Ser. No. 10/634,636, filed Aug. 4, 2003, and "Multi-resistive state element That Uses Dopants," U.S. application Ser. No. 10/604,606, filed Aug. 4, 2003, both already incorporated by reference, describe some mechanisms that may cause a material to have trapped charges.

The Multi-Resistive State Element/Electrode Interface

Trapped charges can be further encouraged at the interface between the multi-resistive state element 710 and its electrode 705 and 715. Although the interfaces between the multi-resistive state element 710 and both the top electrode 715 and the bottom electrode 705 can be treated, it is often useful to only treat one interface. Properly treating a single interface, or subjecting the two interfaces to dissimilar treatments, can bias the memory element in a single direction, thereby encouraging the hysteresis effect.

Treatment of the interface can occur through, for example, ion implantation. In ion implantation accelerated ions penetrate a solid surface up to certain depth that is determined by the ion energy. Ion implantation can be used to introduce dopants, to form buried layers, and to modify solid surfaces. Ion implantation can occur after the bottom electrode 705 is deposited, after the multi-resistive state material 710 is deposited, or after the top electrode 715 is deposited.

Another treatment method is to expose the bottom electrode 705, the multi-resistive state material 710, or the top electrode 715 to either an anneal or a gas at a given temperature within a given ambient. Some anneals can be easily integrated into fabrication. For example, if the array 100 or 500 only has a single memory plug 305 or 610 layer, then the bottom electrode 705 might be subjected to high temperatures in order to properly form the multi-resistive state material 710. However, the top electrode 715 can then be deposited at temperatures far below what is necessary for forming the multi-resistive state material 710. Similar results can be obtained by laser treating one of the surfaces, or exposing one of the surfaces to a plasma process (such as plasma etching).

Yet another treatment method is to insert a layer of material in between one of the multi-resistive state material 710/electrode 705 or 710 interfaces. Common deposition techniques include sputtering, chemical vapor deposition, evaporation, and atomic layer deposition. Such a material might be deposited solely for the purpose of treating the interface, or might serve multiple purposes, such as additionally acting as a seed layer in the bottom electrode 705.

Additionally or alternatively, the layer of material might cause a chemical reaction with the multi-resistive state material 710, and perhaps the electrode 705 or 715. A reaction might simply occur as a result of the material coming into contact with the multi-resistive state material 710, or might require an anneal or exposure to a gas (either immediately after the material's deposition, or after the entire memory plug 305 or 610 is deposited).

An alternative method of causing a chemical reaction in the multi-resistive state material is to use an electrode 705 or 715 that reacts with the multi-resistive state material 710. Such an electrode 705 or 715 can either be immediately reactive, or require a catalyst for reaction (such as anneal or exposure to a gas).

Another treatment method might be to expose the entire structure and/or a particular surface layer to a physical re-sputtering, typically by using Ar and/or $O_2$ or other inert gas plasma. Re-sputtering is a technique commonly used to clean-up surfaces. Since a new film is not deposited when the plasma hits the surface in the sputtering chamber, it can be considered to be the opposite of sputtering. Similarly, the surface can be exposed to an inert ion from an ion gun, bombarding the surface with accelerated inert ions, such as ionized Ar.

Fabrication Examples

Figure 9:
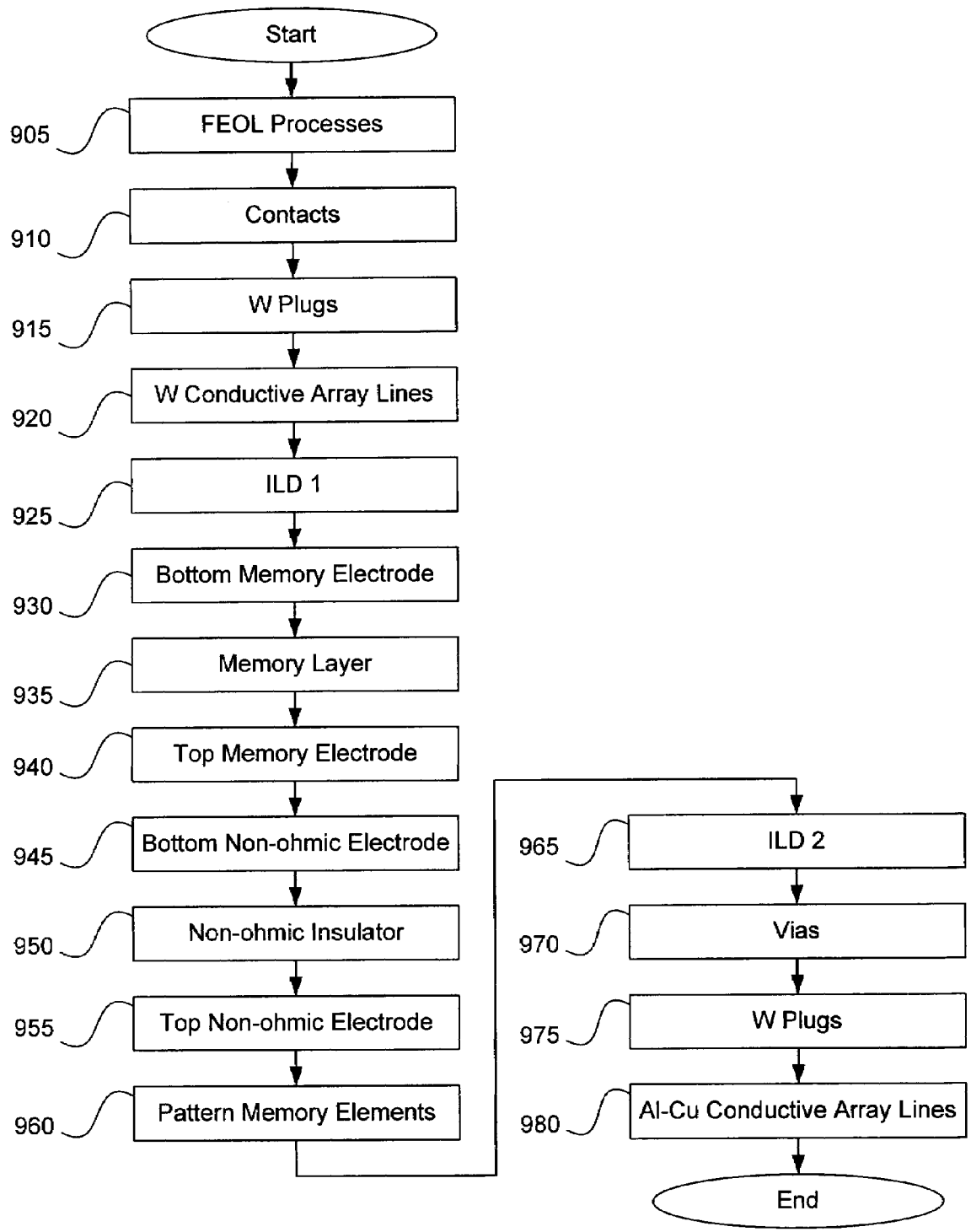
FIG. 9 is an exemplary flow chart of various processing steps that could be involved in a cross point array.
Figure 10:
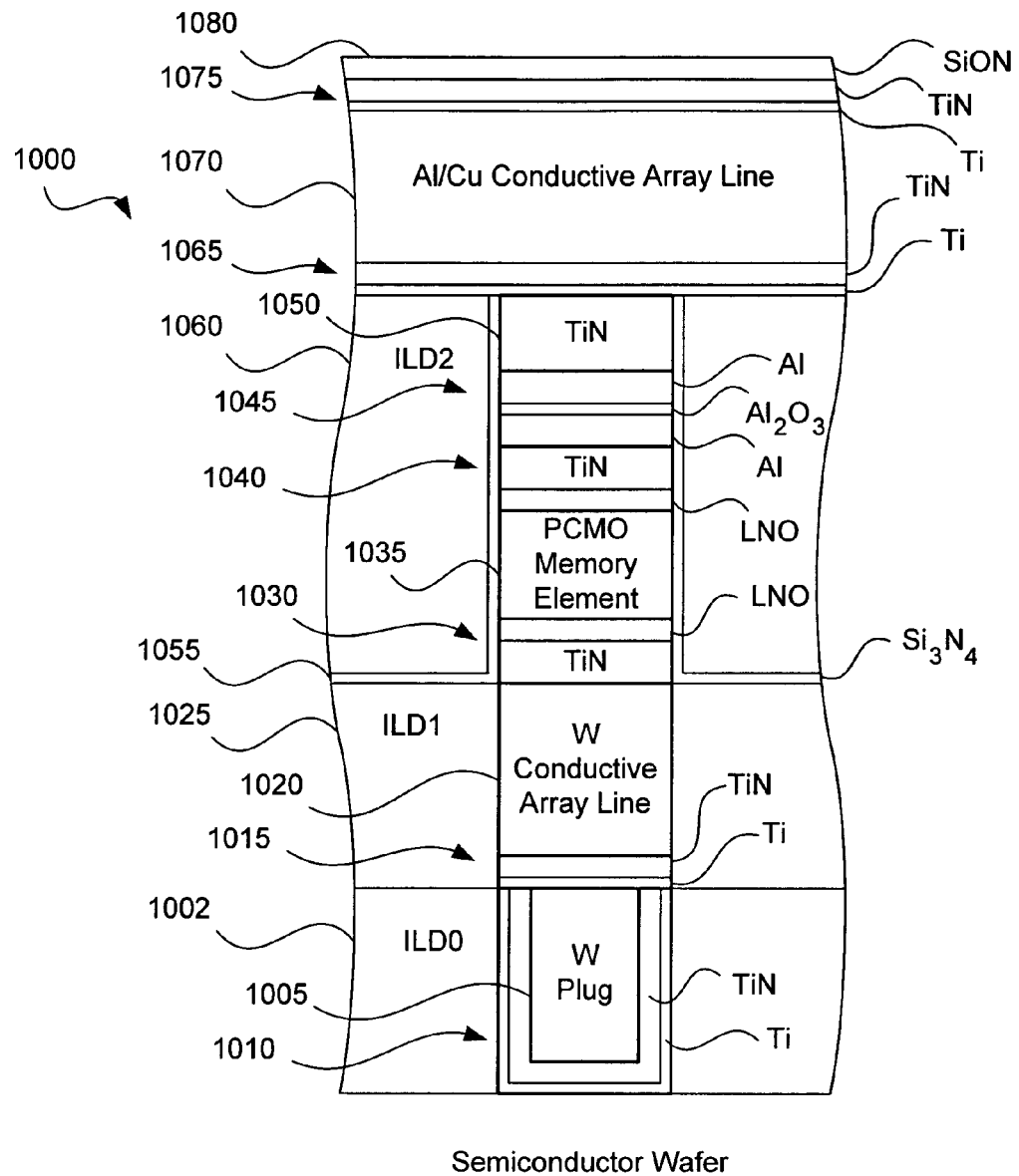
FIG. 10 is an elevation view of an exemplary memory cell that is formed using the processing steps of FIG. 9.

FIG. 9 is an exemplary flow chart of various processing steps that could be involved in an exemplary cross point array. FIG. 10 is an elevation view of a cell 1000 formed with the processing steps. At 905, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD) 1002, such as $SiO_2$.

Regardless of the FEOL process, the next processing step at 910 is formation of contact holes through the ILD 1002 to appropriate positions in the circuitry followed by W plug 1005 formation at 915. A barrier/adhesion layer 1010 of 100 Å of Ti followed by 200 Å of TiN could be sputtered on the wafer, followed by 5000 Å of W deposited using CVD, followed by etchback or CMP to remove W on the ILD surface 1002, leaving W plugs in the contact holes.

Once the plugs are formed, the W conductive array lines 1020 are patterned on the wafer at 920. Since W has a relatively high resistivity, the maximum length and minimum cross-sectional area may be limited in comparison to aluminum or copper. Specifically, the maximum length and cross-sectional area of the conductive array lines 1020 can be determined using R $$R = \frac{\rho L}{A}$$

and setting a maximum resistance to about 10 kΩ in order to maintain fast access times. Assuming 5000 Å thick metallization layers and a feature size of 0.25 µm, the length of the conductive array lines 1020 would be a maximum of about 2000 µm long. The W conductive array lines 1020 can be achieved through a barrier/adhesion layer 1015 of 100 Å of Ti plus 200 Å of TiN, followed by 5000 Å of W deposition through CVD, followed by mask, etch, and resist strip steps.

Another ILD layer 1025 could be deposited over the first layer of conductive array lines at 925. The dielectric layer 1025 can be a thick layer of $SiO_2$, deposited over the W conductive array lines 1020 by plasma-enhanced chemical vapor deposition (PECVD) and then planarized by CMP to expose the top surfaces of the W lines 1020.

At step 930 the bottom electrodes 1030 are deposited. First, a 500 Å thick barrier layer of TiAlN is deposited to prevent metal inter-diffusion, followed by a 200 Å conductive oxide layer of $LaNiO_3$ (LNO) or $SrRuO_3$ (SRO). These layers can be deposited by sputtering. Alternatively to the conductive oxide layer a 500 Å layer of Ir can be deposited, followed by a 200 Å layer of $IrO_2$. These layers can be deposited by reactive sputtering from an Ir target, adding oxygen in the sputtering chamber to create the $IrO_2$ layer.

At step 935 approximately 2000 Å of multi-resistive state element 1035 having a stoichiometry of $Pr_{0.7}Ca_{0.3}MnO_3$ is deposited at about 600° C. by a physical vapor deposition technique such as sputtering. As previously explained, the multi-resistive state element 1035 would have a low resistance of 100 k Ohm and a high resistance of 1 M Ohm, and would change state with a less than 50 ns flat pulse at 2V. At 940 another electrode 1040 (200 Å of LNO or SRO and another 500 Å of TiN are deposited via sputtering) is deposited on top of the multi-resistive state element 1035. At this step an electrode interface treatment, as described above, can be included to enhance the memory properties of the memory cell 1000.

At 945 through 955 the optional non-ohmic device 1045 is formed. The device 1045 can be formed by first sputtering 250 Å of Al, followed by 50 Å of $Al_2O_3$, and another 250 Å of sputtered Al. The $Al_2O_3$ could be formed by atomic layer deposition (ALD) or oxidization of Al. The $Al_2O_3$ thickness would be chosen to achieve a $V_{NO+}$ of 4V. After the optional non-ohmic device 1045, another 500 Å barrier layer 1050 of sputtered TiN is optionally deposited in step 955 to prevent metal inter-diffusion.

At 960 standard photolithography and appropriate multi-step etch processes could be used to pattern the memory/non-ohmic film stack into memory cell plug. At 965 the spaces between the plugs could then be filled in by depositing a 250 Å etch stop/diffusion barrier 1055 of $Si_3N_4$, followed by a thick $SiO_2$ interlayer dielectric (ILD) 1060, which is planarized by CMP.

An etch stop layer is used to ensure a thin-film does not get removed during processing. When etching a thin-film layer, the actual etch time is normally longer than that minimum time required to etch through the film. This overetch time, typically 20-50% of the minimum etch time, is added to allow for variations in film thickness and variations in etch rate due to pattern density. An etch stop layer, with an etch rate significantly lower than that of the film being etched, can be used to protect the layers beneath it from attack during the overetch time. The etch stop layer can later be removed or etched through in selected locations by using a different etch method (e.g. different chemistry) producing a high etch rate for the etch stop layer and a lower etch rate compared to underlying layers.

The diffusion barrier 1055 additionally protects the memory plugs from inter-diffusion with the surrounding dielectric 1060. Regardless of whether such an insulating barrier 1055 is necessary for the entire plug, or only certain components, it is often useful to coat the entire plug with the diffusion barrier 1055 for simplicity.

At 970 via holes are formed (not shown in FIG. 10). Via holes with W plugs could be formed to contact the tops of the memory cell islands and are one mechanism that can be used to provide connections between metal interconnect layers. Standard photolithography and a 2-step via etch (stopping first on the $Si_3N_4$ layer 1055, then etching through it) could be used to expose the tops of the memory cell islands. These via holes could be filled by depositing 100 Å of Ti, followed by 200 Å of TiN, followed by a 5000 Å W layer. CMP could then be used to remove W on the ILD surface 1060, leaving the W plugs in the via holes.

If there are no more memory elements to form at high temperature, the final layer of conductive array lines may comprise aluminum, copper or other high conductivity metal. A top layer of conductive array lines could then be formed at 980 by depositing, in order, another barrier/adhesion layer 1065 of 100 Å of Ti and 200 Å of TiN, then the conductive array line 1070 comprising 5000 Å of an Al/Cu mixture, and then a final barrier/adhesion layer 1075 of 100 Å of Ti, 200 Å of TiN. An anti-reflective coating (ARC) 1080, such as SiON could also be deposited. A final mask, etch and resist strip would then be performed. The final cross-point memory array could then be 16384 W conductive array lines by 4096 Al/Cu conductive array lines to create a 64 Mbit array. 16 of these arrays could be laid side-by-side to create a 1 Gbit memory.

Note that the above example assumes that memory elements are formed by a high temperature process that could be incompatible with conventional aluminum and copper deposition processes. Other processes for forming memory elements at low temperatures exist. These include facing target sputtering and laser annealing, which are described in co-pending U.S. patent applications, "Laser Annealing of Complex Metal Oxides (CMO) Memory Materials for Non-Volatile Memory Integrated Circuits," U.S. application Ser. No. 10/387,799, filed Mar. 13, 2003, and "Low Temperature Deposition of Complex Metal Oxides (CMO) Memory Materials for Non-Volatile Memory Integrated Circuits," U.S. application Ser. No. 10/387,773, filed Mar. 13, 2003, both hereby incorporated herein by reference in their entireties and for all purposes.

Similarly, FIGS. 11-15 describe one possible technique that can be used to fabricate an exemplary two-dimensional transistor memory array, using specific materials.

Figure 11:
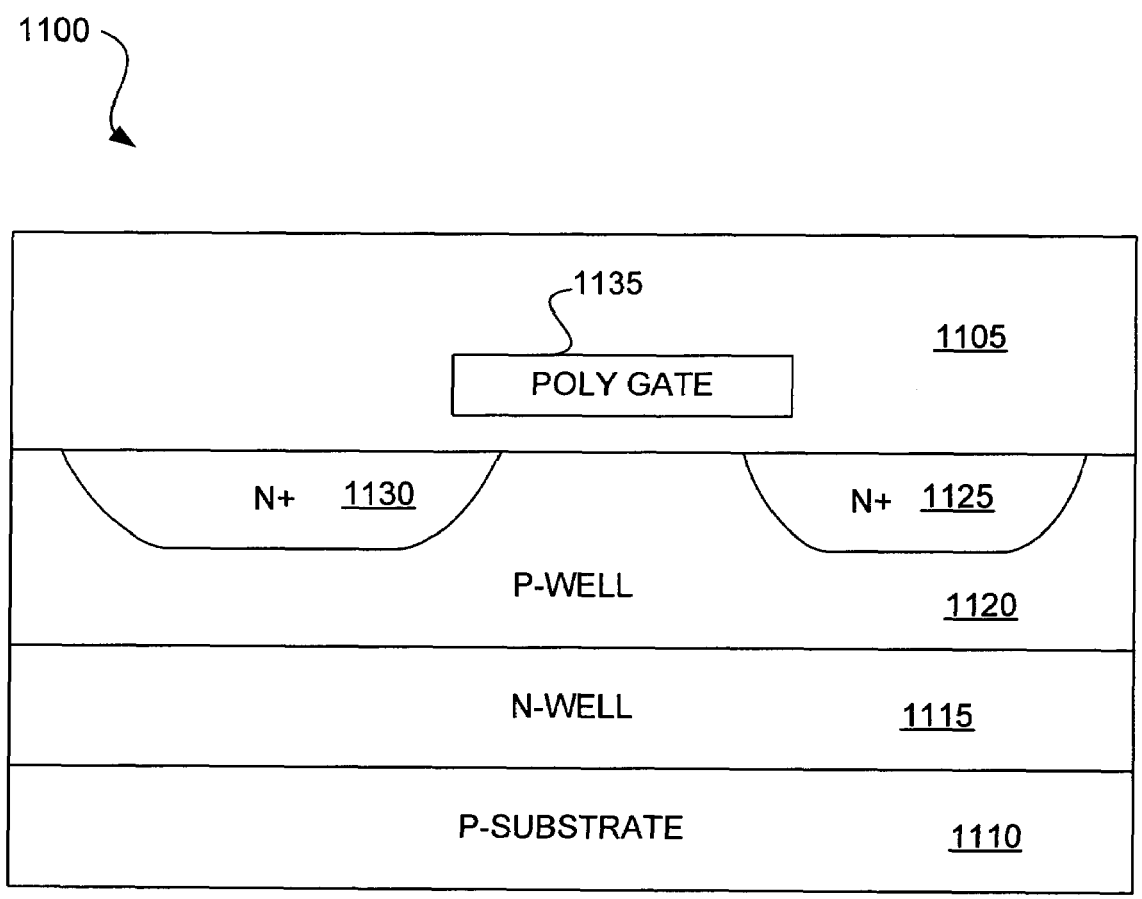
FIG. 11 depicts a cross sectional diagram of a partially formed cell after standard front end of line processes are completed.

FIG. 11 is a cross sectional diagram of a partially formed cell 1100 after standard front end of line (FEOL) processes are completed. A p-type substrate 1110, which lies beneath an n-well 1115, which, in turn, is underneath a p-well 1120 is depicted. N-junctions 1125 and 1130 are formed in the p-well 1120. Since the data lines may be at −2V, the isolated p-well 1120 allows the n-junctions 1125 and 1130 to always be reverse-biased, even at negative voltages. A select line 1135 can be formed as a standard polysilicon gate. The FEOL processes generally ends with a chemical-mechanical polishing (CMP) of $SiO_2$ as an inter-layer dielectric (ILD) 1105.

Figure 12:
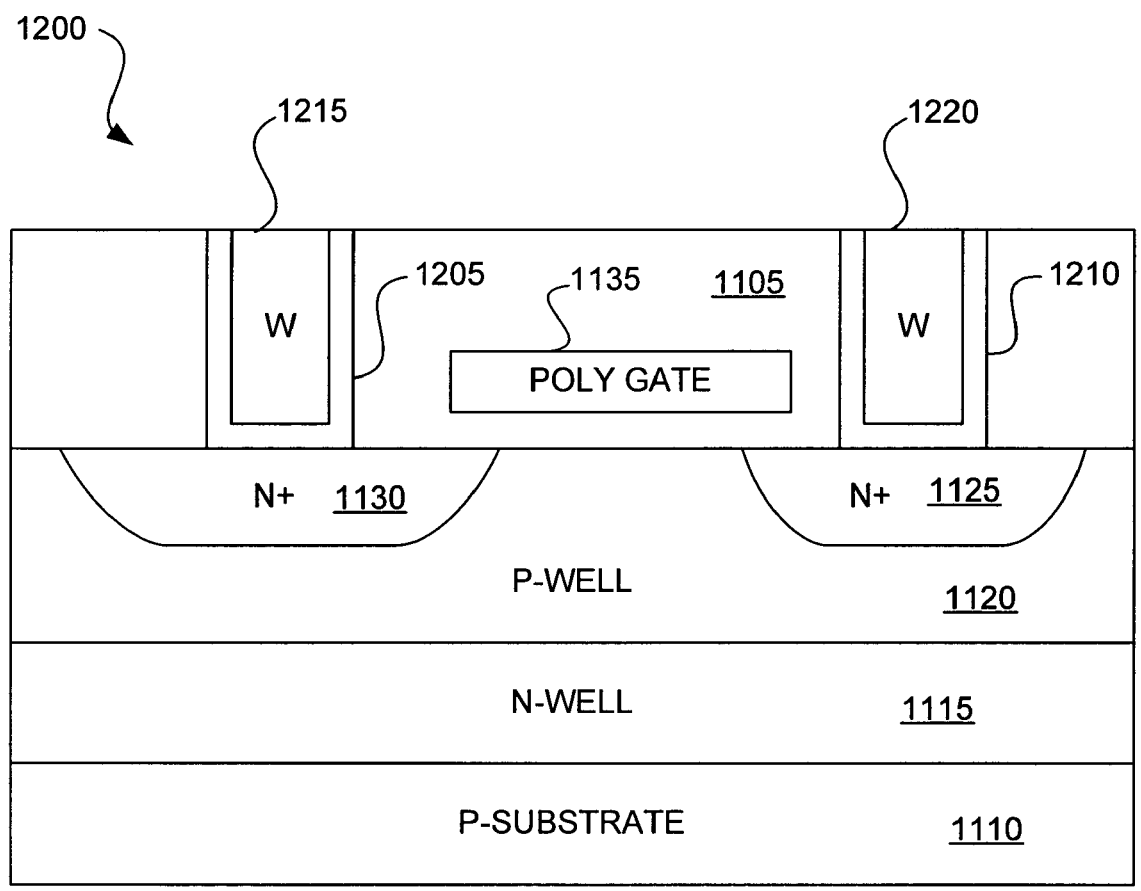
FIG. 12 depicts a cross sectional diagram of the partially formed cell of FIG. 11 after tungsten plug formation.

FIG. 12 is a cross sectional diagram of a partially formed cell 1200 after tungsten (W) plug formation. After the FEOL process, the next processing step is formation of contact holes through the ILD 1105. A barrier/adhesion layer 1205 and 1210 of 100 Å of Ti followed by 200 Å of TiN can be sputtered on the wafer, followed by 5000 Å of W, deposited using CVD, followed by etchback or CMP to remove W on the ILD 1105 surface, leaving W plugs 1215 and 1220 in the contact holes.

Figure 13:
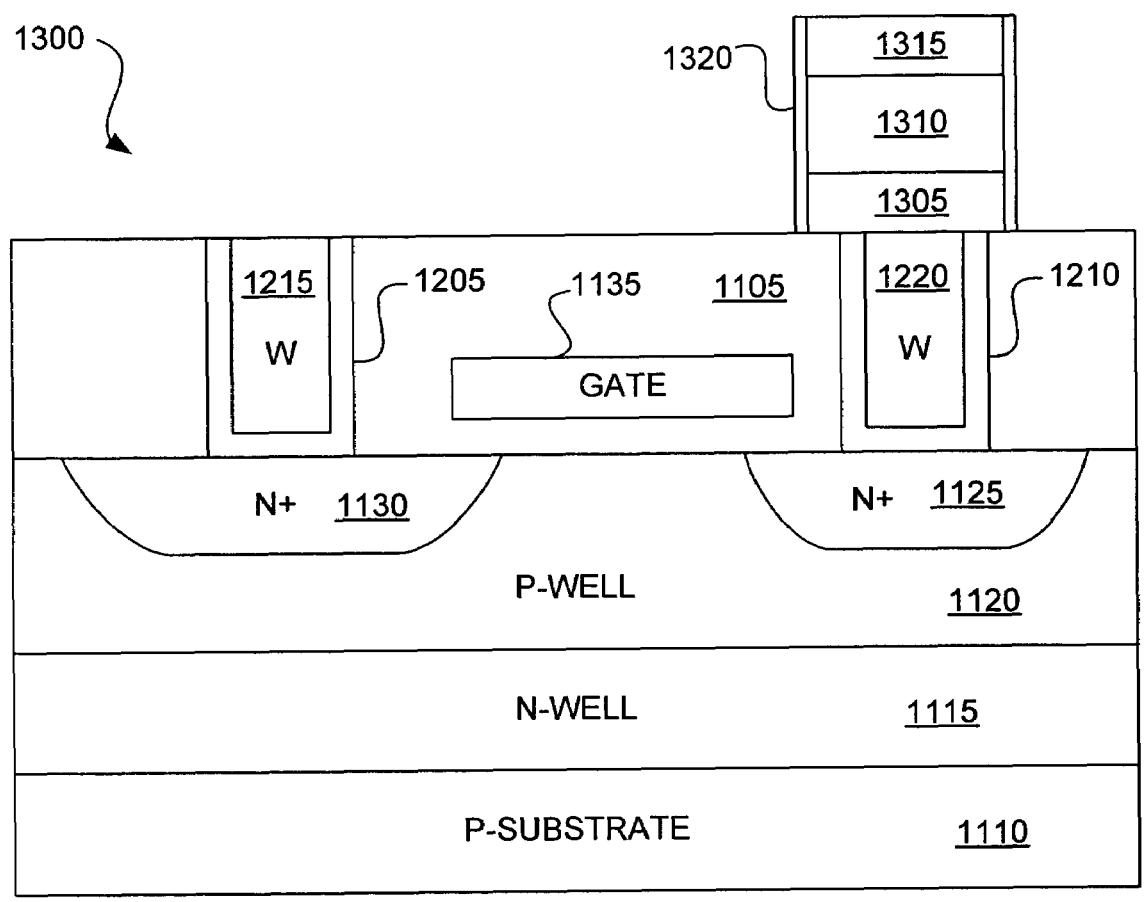
FIG. 13 depicts a cross sectional diagram of the partially formed cell of FIG. 12 after the memory plugs are formed.

FIG. 13 is a cross sectional diagram of a partially formed cell 1300 after the memory plugs are formed. First, the bottom electrode 1305 is deposited. The bottom electrode 1305 can have two layers, a 500 Å thick barrier layer of TiAlN to prevent metal inter-diffusion, followed by a 200 Å seed layer of $LaNiO_3$. These layers can be deposited by sputtering. Alternatively to the $LaNiO_3$ layer a 500 Å layer of Ir can be deposited, followed by a 200 Å layer of $IrO_2$. These layers can be deposited by reactive sputtering from an Ir target, adding oxygen in the sputtering chamber to create the $IrO_2$ layer.

2000 Å of multi-resistive state element 1310 having a stoichiometry of $Pr_{0.7}Ca_{0.3}MnO_3$ can then be deposited at about 600° C. by a physical vapor deposition technique such as sputtering, and then annealed. The top electrode 1315 (200 Å of $SrRuO_3$ and another 500 Å of TiAlN) is deposited on top of the memory element 1310 via sputtering. Alternatively the top electrode 1315 can be deposited as 200 Å of $IrO_2$, 500 Å of Ir and 500 Å of TiAlN via sputtering. At this step an electrode interface treatment, as described above, can be applied to the layers 1305, 1310, and 1315 to enhance the memory properties of the memory cell 1300. Standard photolithography and appropriate multi-step etch processes can then be used to pattern the electrode/memory/electrode layers into memory cell plug. 250 Å of $Si_3N_4$ or $TiO_2$ might then be deposited as an etch stop/diffusion barrier 1320, to protect the PCMO film from inter-diffusion.

Figure 14:
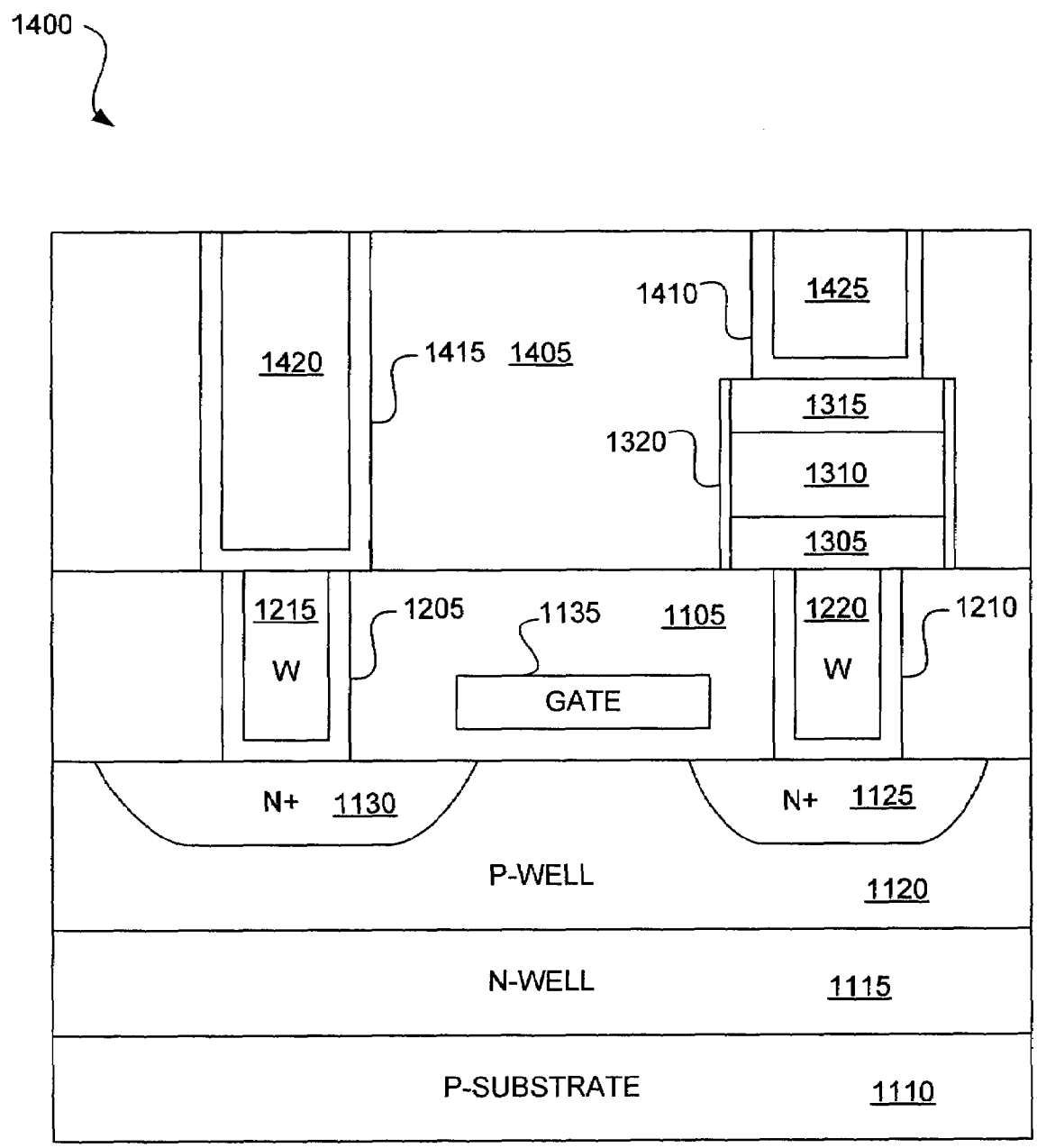
FIG. 14 depicts a cross sectional diagram of the partially formed cell of FIG. 13 after the second set of W plugs are formed.
Figure 15:
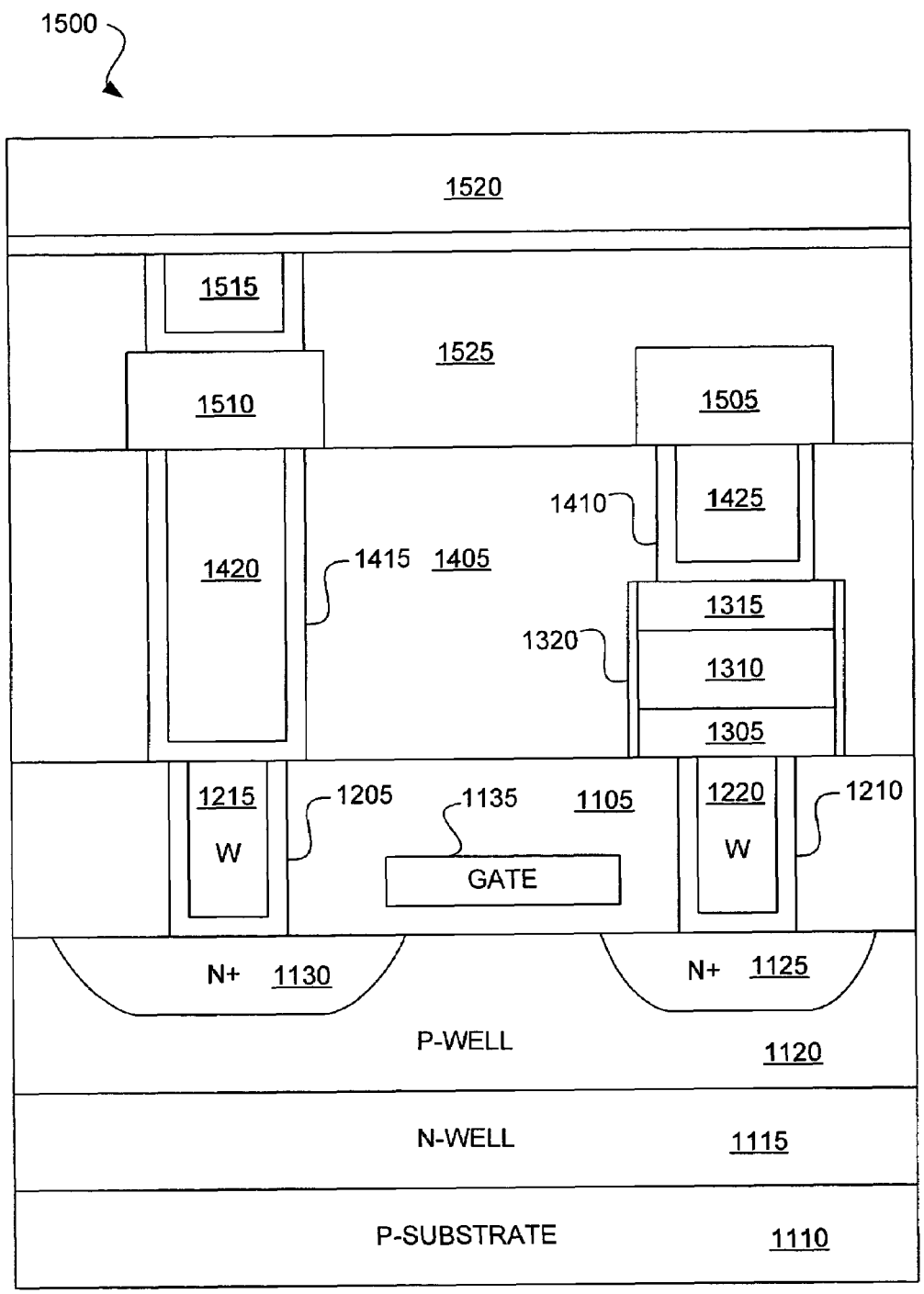
FIG. 15 depicts a cross sectional diagram of a completely formed cell.

FIG. 14 is a cross sectional diagram of a partially formed cell 1400 after the second set of W plugs are formed. After the memory plug is fully formed, a thick $SiO_2$ layer as a second ILD 1405 is deposited and planarized by CMP. The via holes are then formed with standard photolithography and via etch. The via holes could be filled by depositing a barrier/adhesion layer 1410 and 1415 of 100 Å of Ti, followed by 200 Å of TiN, followed by W plug layer 1420 and 1425 of 5000 Å of W. CMP could then be used to remove W on the ILD surface 1405, leaving the W plugs 1420 and 1425 in the via holes FIG. 15 is a cross sectional diagram of a completely formed cell 1500. Using standard processes, two metalization layers can be formed above the partially formed cell 1400 of FIG. 14. The first metalization layer can be used to form both the reference line 1505 and a metal pad 1510, which eventually connects two tungsten plugs 1420 and 1515. The second tungsten plug 1515 is used to connect the data line 1520, which is formed during the second metalization layer, to the metal plug 1510, through a third ILD 1525, which is used to support the data line 1520.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A resistive memory device comprising:
   a conductive bottom electrode having a top surface;
   a multi-resistive state element having a top surface and a bottom surface, the bottom surface of the multi-resistive state element arranged on top of and in direct physical contact with the top surface of the conductive bottom electrode, the multi-resistive state element having a substantially crystalline layer that, while substantially maintaining its substantially crystalline structure has a modifiable resistance;

a conductive top electrode having a bottom surface and arranged on top of and in direct physical contact with the top surface of the multi-resistive state element, wherein the resistance of the resistive memory device may be changed by applying a first voltage having a first polarity across the conductive electrodes and reversibly changed by applying a second voltage having a second polarity across the conductive electrodes;

a top interface created by the direct physical contact between the bottom surface of the top electrode and the top surface of the multi-resistive state element; and a bottom interface created by the direct physical contact between the top surface of the bottom electrode and the bottom surface of the multi-resistive state element, at least one of the top interface or the bottom interface includes at least one treatment primarily directed towards changing properties of the at least one interface, wherein the at least one treatment is an exposure to a gas, wherein the exposure to the gas causes a chemical reaction in the multi-resistive state material, and whereby the properties of the at least one interface are changed by the at least one treatment.

2. A resistive memory device comprising:

a conductive bottom electrode having a top surface;

a multi-resistive state element having a top surface and a bottom surface, the bottom surface of the multi-resistive state element arranged on top of and in direct physical contact with the top surface of the conductive bottom electrode, the multi-resistive state element having a substantially crystalline layer that, while substantially maintaining its substantially crystalline structure, has a modifiable resistance;

a conductive top electrode having a bottom surface and arranged on top of and in direct physical contact with the top surface of the multi-resistive state element, wherein the resistance of the resistive memory device may be changed by applying a first voltage having a first polarity across the conductive electrodes and reversibly changed by applying a second voltage having a second polarity across the conductive electrodes;

a top interface created by the direct physical contact between the bottom surface of the top electrode and the top surface of the multi-resistive state element; and a bottom interface created by the direct physical contact between the top surface of the bottom electrode and the bottom surface of the multi-resistive state element, at least one of the top interface or the bottom interface includes at least one treatment primarily directed towards changing properties of the at least one interface, wherein the at least one treatment is caused by a chemical reaction between one of the conductive electrodes and the multi-resistive state element, and whereby the properties of the at least one interface are changed by the at least one treatment.

3. The resistive memory device of claim 2, wherein:

an anneal process is a catalyst for the chemical reaction.

4. The resistive memory device of claim 2, wherein:

an exposure to a gas is a catalyst for the chemical reaction.

5. A resistive memory device comprising:

a conductive bottom electrode having a top surface;

a multi-resistive state element having a top surface and a bottom surface, the bottom surface of the multi-resistive state element arranged on top of and in direct physical contact with the ton surface of the conductive bottom electrode, the multi-resistive state element having a substantially crystalline layer that, while substantially maintaining its substantially crystalline structure, has a modifiable resistance;

a conductive top electrode having a bottom surface and arranged on top of and in direct physical contact with the top surface of the multi-resistive state element, wherein the resistance of the resistive memory device may be changed by applying a first voltage having a first polarity across the conductive electrodes and reversibly changed by applying a second voltage having a second polarity across the conductive electrodes;

a top interface created by the direct physical contact between the bottom surface of the top electrode and the top surface of the multi-resistive state element; and a bottom interface created by the direct physical contact between the top surface of the bottom electrode and the bottom surface of the multi-resistive state element, at least one of the top interface or the bottom interface includes at least one treatment primarily directed towards changing properties of the at least one interface, wherein the at least one treatment is caused by a bombardment by inert ions, and whereby the properties of the at least one interface are changed by the at least one treatment.

6. The resistive memory device of claim 1, wherein:

the substantially crystalline layer is fabricated to be polycrystalline.

7. The resistive memory device of claim 1, wherein:

the substantially crystalline layer is fabricated to be a perovskite.

8. The resistive memory device of claim 7, wherein:

the treatment, to which the at least one interface is subjected, is directed towards changing properties of the perovskite.

* * * * *